(12) United States Patent
Murchison et al.

(10) Patent No.: US 9,307,656 B2
(45) Date of Patent: Apr. 5, 2016

(54) ELECTRONIC DEVICE CASE

(71) Applicant: BlackBerry Limited, Waterloo (CA)

(72) Inventors: Ian James Murchison, Ottawa (CA); Mircea Oprea, Waterloo (CA); Felipe Oliveira Simoes, Kitchener (CA); Donald Glenn Thompson, Guelph (CA); Anders Fahrendorff, Ottawa (CA)

(73) Assignee: BlackBerry Limited, Waterloo, Ontario (CA)

( * ) Notice: Subject to any disclaimer, the term of this patent is extended or adjusted under 35 U.S.C. 154(b) by 11 days.

(21) Appl. No.: 13/745,115

(22) Filed: Jan. 18, 2013

(65) Prior Publication Data

US 2014/0202899 A1   Jul. 24, 2014

(51) Int. Cl.
*H05K 5/02* (2006.01)
*H05K 5/00* (2006.01)
*G06F 1/16* (2006.01)

(52) U.S. Cl.
CPC .............. *H05K 5/0013* (2013.01); *G06F 1/166* (2013.01); *G06F 1/1626* (2013.01); *G06F 1/1628* (2013.01); *H05K 5/0234* (2013.01)

(58) Field of Classification Search
CPC ........... B65D 5/5206; A45C 2011/001; A45C 2011/002; A45C 2011/003; H05K 5/0013; H05K 5/0234; H05K 5/0086; G06F 1/1026; H04M 1/04
USPC ......... 206/45.23, 45.24, 45.2, 320; 455/575.8
See application file for complete search history.

(56) References Cited

U.S. PATENT DOCUMENTS

| | | | | |
|---|---|---|---|---|
| 1,389,728 | A * | 9/1921 | Akimoff | 16/226 |
| 3,937,389 | A * | 2/1976 | Wind | 229/406 |
| D634,315 | S * | 3/2011 | Nousiainen | D14/253 |
| D640,679 | S * | 6/2011 | Willes et al. | D14/250 |
| 8,297,440 | B2 * | 10/2012 | Schmidt et al. | 206/320 |
| 8,359,078 | B2 * | 1/2013 | Hung | 455/575.8 |
| D682,817 | S * | 5/2013 | Murchison et al. | D14/250 |
| 8,490,783 | B1 * | 7/2013 | Fan | 206/45.23 |
| 8,727,116 | B2 * | 5/2014 | Kim et al. | 206/320 |
| 8,774,882 | B2 * | 7/2014 | Tages et al. | 455/575.8 |
| D712,391 | S * | 9/2014 | Kim et al. | D14/250 |
| 8,960,421 | B1 * | 2/2015 | Diebel | 206/45.2 |
| 2010/0072334 | A1 * | 3/2010 | Le Gette et al. | 248/176.3 |
| 2010/0300909 | A1 * | 12/2010 | Hung | 206/320 |
| 2013/0098789 | A1 * | 4/2013 | Jun et al. | 206/320 |
| 2013/0140194 | A1 * | 6/2013 | Han | 206/45.23 |
| 2014/0004915 | A1 * | 1/2014 | Huang | 455/575.8 |
| 2015/0001105 | A1 * | 1/2015 | Nyholm et al. | 206/45.2 |

* cited by examiner

*Primary Examiner* — Steven A. Reynolds
(74) *Attorney, Agent, or Firm* — Jon Gibbons; Fleit Gibbons Gutman Bongini & Bianco P.L.

(57) ABSTRACT

A case configured to protect at least a portion of an electronic device. The case can comprise a first portion and a second portion that connect to one another via a hinge. The first portion can be configured to cover a first portion of a back side of the electronic device when fully installed on the electronic device. The second portion can be configured to cover a remaining portion of the back side of the electronic device when also fully installed on the electronic device. The second portion and the first portion can pivot with respect to one another via the hinge. Accordingly, by one approach, the second portion can be pivoted away from the electronic device while the first portion remains installed on the electronic device. In such a case, and by one approach, the second portion can serve as a stand for the electronic device.

10 Claims, 9 Drawing Sheets

ELECTRONIC DEVICE CASE

FIELD OF TECHNOLOGY

The present disclosure relates to electronic devices and more particularly to cases for electronic devices.

BACKGROUND

Electronic devices, including numerous portable electronic devices, have gained widespread use and may provide a variety of functions including, for example, telephonic, electronic messaging and other personal information manager (PIM) application functions. Electronic devices include, for example, several types of mobile stations such as simple cellular telephones, so-called smart telephones or (smart phones), wireless personal digital assistants (PDAs), digital audio/video players, digital audio/video recorders, navigation devices (such as global positioning system navigators), remote controls, and laptop or pad/tablet-styled computers, which may have wireless 802.11, Bluetooth™, and/or near-field communications capabilities.

Many electronic devices are not only portable (capable of being readily moved from place to place) but may also be handheld (that is, sized and shaped to be held and carried in a human hand, and capable of being used while held or carried). Some electronic devices, including some electronic devices that can be used while held or carried, can be used while the electronic device rests upon a supporting surface such as a table or desk. Although portability may have many advantages, portability may also entail risks of a variety of accidents or incidents (such as dropping the device or bringing the device into harsh contact with another object or surface) that can lead to cosmetic blemishes, immediate failure of the device, or a shortened operating lifetime for the device.

DETAILED DESCRIPTION

In general, described herein are illustrative embodiments of cases for electronic devices that may furnish protection against impacts (preventing or reducing damage to the electronic device from some impacts) while also enhancing the functionality or usefulness of the device. Although various cases serve to protect electronic devices from damage such as drops and impacts, or reduce the damage, such cases typically do not contribute to enhancing the functionality of the electronic device.

The following describes an apparatus configured for use with a corresponding electronic device. The apparatus can comprise, for example, a case configured to protect at least a portion of that electronic device. (In this disclosure, elements may be described as "configured to" perform or "configured for" performing one or more functions. In general, an element that is configured for performing or configured to perform a function is suitable for performing the function, or is adapted to perform the function, or is operable to perform the function, or is otherwise capable of performing the function.) That case can comprise a first portion and a second portion that connect to one another via a hinge. These two portions can be configured to each separately attach to the electronic device. The first portion can be configured to cover a first portion of a back side of the electronic device when fully installed on the electronic device. The second portion can be configured to cover a remaining portion of the back side of the electronic device when also fully installed on the electronic device.

The second portion and the first portion can pivot with respect to one another via the aforementioned hinge. Accordingly, by one approach, the second portion can be pivoted away from the electronic device while the first portion remains installed on the electronic device. In such a case, and by one approach, the second portion can serve as a stand for the electronic device.

The present teachings are highly flexible in practice and will accommodate a wide variety of variations and practices in these regards. For example, by one approach the first and second portions, along with the hinge, can comprise a unitary structure (such as, but not limited to, a co-molded structure). As another example, in lieu of the foregoing or in combination therewith the first and second portions can be comprised of both a rigid layer and a flexible layer. So configured, the rigid layer can face outwardly of the electronic device to provide considerable protection for the electronic device against impact with other surfaces. The flexible layer, in turn, can provide a softer physical interface and buffer between the rigid exterior of the case and the electronic device itself. The flexible layer can also aid in helping to secure the case in an installed state on the electronic device.

By one approach the aforementioned hinge can comprise the aforementioned flexible layer. If desired, the hinge can include, at least in part, a groove formed in the flexile layer. Also if desired, one or more slots or openings (that is, an absence or void of material) can be formed within that groove to further contribute to the ease with which the hinge can serve as a pivot point for the first and second portions of the case.

So configured, a useful case can be readily installed and uninstalled as desired. While installed the case provides considerable protection for the back side of the electronic device as well as, in some cases, the corners of the electronic device. By moving the second portion between a fully-installed state and a stand state the case can also provide a useful stand by which the electronic device can be placed in an upright position to facilitate hands-free viewing of the electronic device. Other benefits are discussed further below.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

Figure 1:
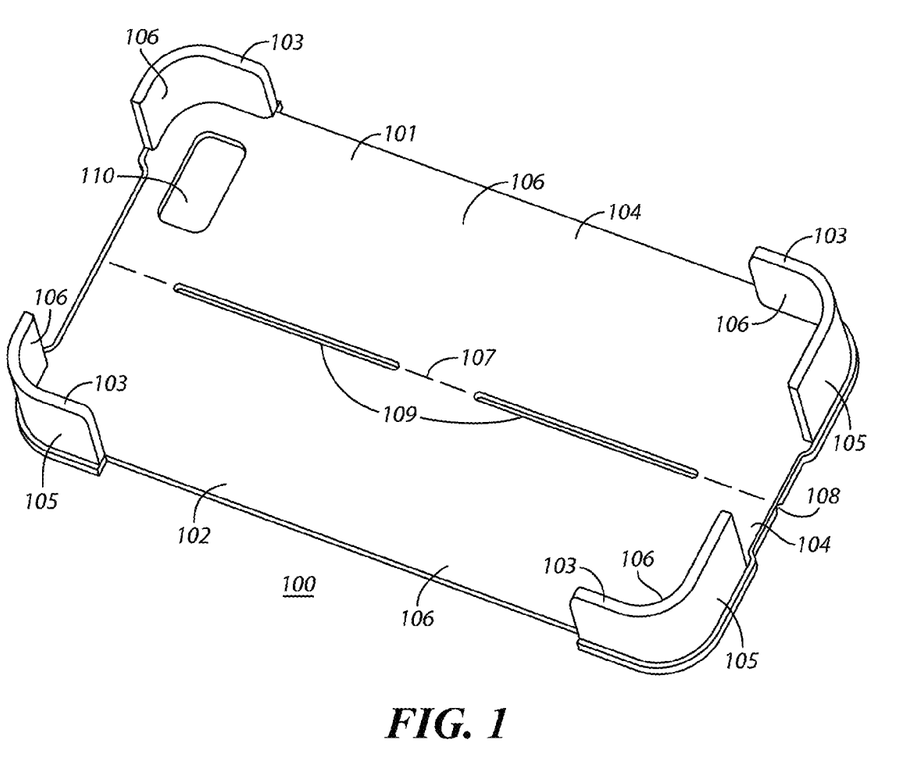
FIG. 1 is a perspective view in accordance with the disclosure.
Figure 2:
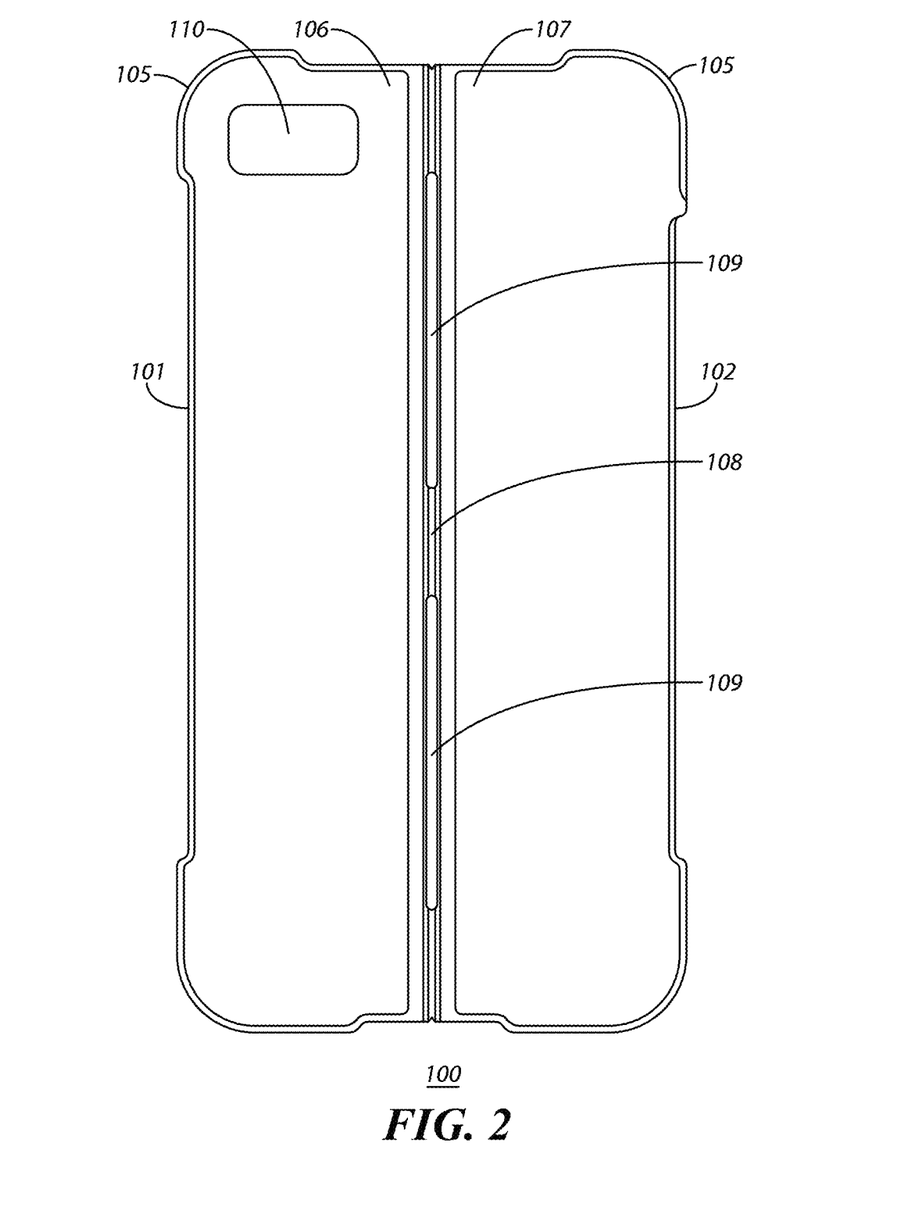
FIG. 2 is a top plan view in accordance with the disclosure.
Figure 3:
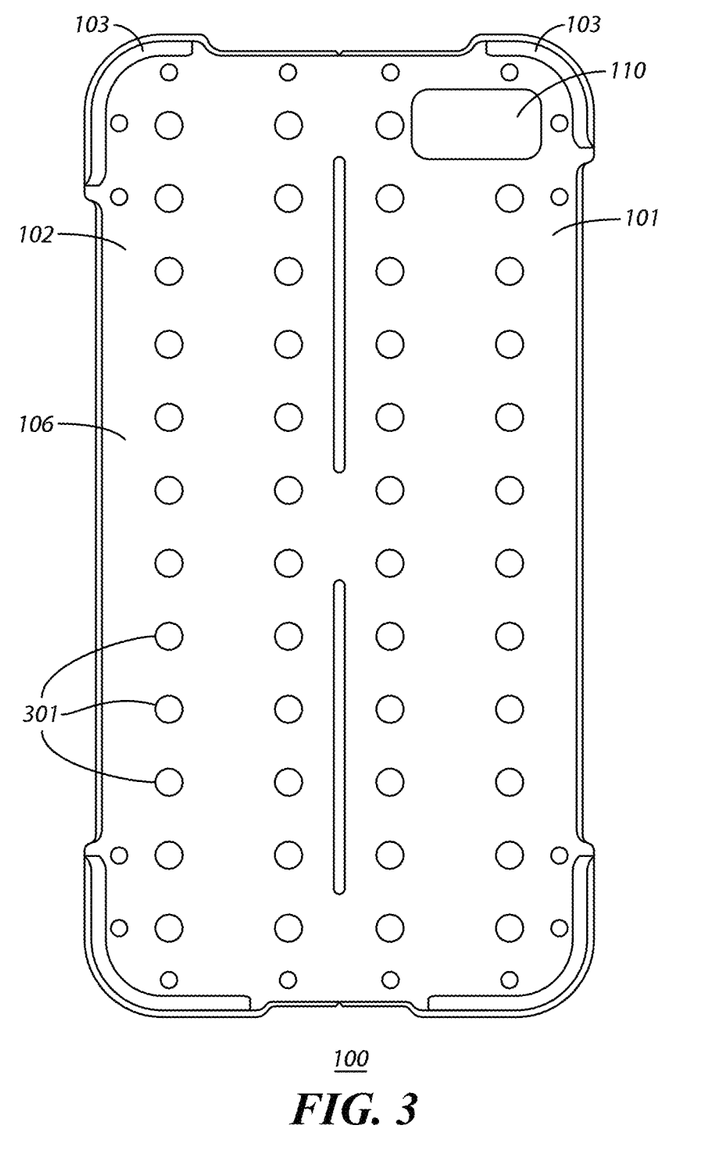
FIG. 3 is a bottom plan view in accordance with the disclosure.

FIGS. 1, 2, and 3 present various views of a case 100 that is configured for use with a corresponding electronic device. For purposes of illustration, the case 100 will be depicted in the context of use with a so-called smart telephone or a tablet-styled computer. Although the term "case" will be used, the case may also be described, for example, as a container, casing, holder, shell or other receptacle. The case 100 may be sized and shaped for use with a particular electronic device or a group of electronic devices. The specific form factor of the case 100 can be varied or otherwise configured to suit the particular requirements of a given electronic device. For example, the case 100 may be sized and shaped to hold or receive an electronic device, or may have one or more physical features (such as cutouts, notches, openings, flaps and the like) to accommodate various physical features of the device. An example of such an accommodating feature will be described below.

In this illustrative example, the case 100 includes both a first portion 101 and a second portion 102. The first portion 101 is configured (via an appropriate size and shape) to cover a first portion of the back side of the aforementioned electronic device when fully installed thereon. In a typical example, the back side of an electronic device represents a side of the device with which the user may have less interaction. In a tablet computer, for instance, the user may ordinarily or predominantly interact with a touch screen display on the front side of the tablet, and may interact less often with the obverse or back side of the tablet. The back side may be devoid of functional components, but need not be; various electronic devices may include a camera, microphone, or connection port on the back side, for example.

The second portion 102, in turn, is similarly configured to cover a remaining portion of the back side of the electronic device when fully installed on the electronic device. Generally speaking, "to cover" includes to overlay, to surround, to shield, to house, and to protect. As discussed below, covering includes fully or completely covering, as well as substantially covering. Covering, as shown by the figures and accompanying description, does not necessarily mean that the entire electronic device is encased, nor that the electronic device is concealed from view. Indeed, various embodiments described herein involve cases that may leave the entire front side of the device uncovered for ready interaction by or with a user. Further, the cover 100 is "fully installed" when the electronic device is completely engaged with or retained by the cover 100. Typically, the electronic device is fully engaged with the cover 100 when the device fits substantially completely, perhaps snugly, in the cover 100. In a typical embodiment, the electronic device will not physically separate from a fully installed cover 100 in ordinary usage, although a user may typically engage the device to or disengage the device from the cover 100 without a need for tools. Also, as discussed herein, the cover 100 may include two or more portions, and each portion may independently be fully installed on the device.

In this particular example of FIGS. 1, 2, and 3, the first portion 101 and the second portion 102 are of essentially equal size and hence each accounts for nearly one half of the case 100. Such proportions, however, are not a requirement. If desired, for example, the second portion 102 could comprise one fourth of the entire case, or three fourths of the entire case, or essentially any other percentage or proportion. Further, there is no requirement that there be two and only two portions.

Also as will become clearer below, per this specific example, these two portions 101 and 102 of the case 100 in combination cover essentially the entire back side of the electronic device. Again, however, the specifics of this illustrative example should not be taken as a suggestion regarding any limitations in these regards. Instead, if and as desired, it would be possible for the first portion 101 of the case 100 to cover a first portion of the electronic device's back side and for the second portion 102 of the case 100 to cover a remaining portion of the electronic device's back side that does not constitute all of the remaining area of that back side (in other words, the "remaining portion" covered by the second portion 102 of the case 100 need not always be the entire portion of the back side that remains uncovered by the first portion 101 of the case 100).

Each of these portions 101 and 102 has a pair of corners 103. These corners 103 are configured to fit snuggly over the corners of the electronic device. So configured, these corners 103 serve to retain the case 100 in an installed position on the electronic device (via, for example, a friction fit or a retaining lip) while also providing impact protection to those electronic device corners. In general, a case 100 may be configured to protect an electronic device when part of the case covers or shields or guards or is interposed between a part of the electronic device that may be at risk of impact or at risk of damage from an impact, and the item being impacted (e.g., the floor).

Figure 4:
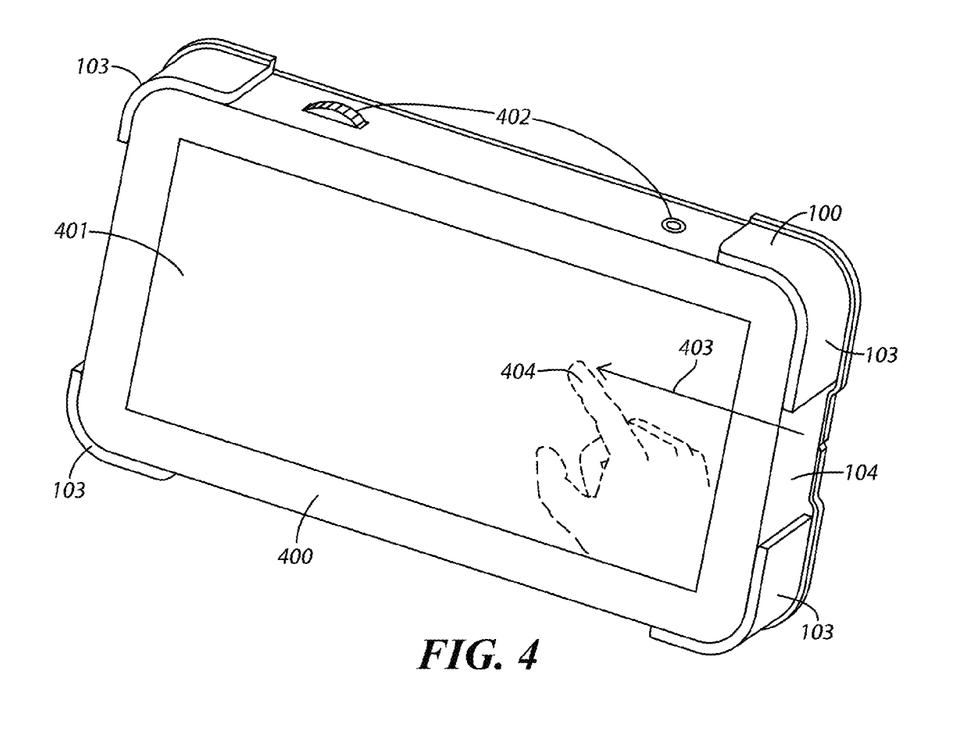
FIG. 4 is a perspective view in accordance with the disclosure.

FIG. 4 presents the case 100 fully installed on a corresponding electronic device 400. Notwithstanding this installed state the electronic device's display 401 remains fully visible as no part of the case 100 serves to occlude any part of the display 401. From the point of view of the user, the display 401 is on the front side of the device 400. In some embodiments, part of the front side, such as corners or edges, may be covered by the case 100. As depicted in FIG. 4, a very small or negligible percentage of the front side of the device 400 may be covered.

It will be noted that in this illustrative example these corners 103 are relatively free standing such that significant gaps 104 exist between each pair of adjacent corners 103. These gaps 104, in turn, can provide space for various control surfaces and interfaces 402 on the sides of the electronic device (such as, but not limited to, headphone sockets, volume controls, Universal Serial Bus (USB) sockets, charging electrodes, and so forth). Accordingly, the various control surfaces and interfaces that may be present on the sides of a given electronic device can remain readily accessible to the user notwithstanding installation of such a case 100. The gaps 104 may also supply some gross flexibility to the cover 400, which may be useful in assisting a user installing the cover 100 on the electronic device 400.

Further, these gaps may help to ensure an obstruction-free gesturing experience for the user. For example, a user's gesture 403 formed using a finger 404 can begin to the side of the electronic device 400 and move across the electronic device 400 without likely contacting any part of the case 100. Such a configuration can help to provide the user with a more intuitive and natural gesturing experience notwithstanding the presence of the case 100 during use of the electronic device 400.

Referring again to FIGS. 1, 2, and 3, the case 100 can comprise, if desired, a unitary structure (such as a co-molded structure) where the various components of the case 100 are permanently and integrally connected to one another. By one approach the case can comprise, at least in part, a rigid layer 105 and a flexible layer 106. As an example in these regards, the rigid layer 105 can comprise a polycarbonate material while the flexible layer 106 can comprise a thermoplastic elastomer. Those skilled in the art will understand and appreciate that such materials can be co-molded as co-layers with one another using, for example, a two-shot injection machine as is known in the art. These materials are for purposes of illustration, and additional or different materials may be used. For example, rigid components may be constructed from one or more materials such as plastic, metal, silicone, or ceramic, and flexible components may be constructed from one or more materials such as plastic, silicone, rubber, elastic, or cloth. Materials may be selected in consideration of factors such as durability, robustness, impact resistance, structural integrity, weight, electrical conductive, or insulative properties, cosmetic appearance, texture, comfort, and the like. As noted above, some components may be integrally formed, e.g., part of a single-piece article that may share structures and materials, or may comprise discrete components that may be fastened together in any fashion. Further, the terms rigid and flexible are used herein in relation to one another. For example, a rigid material may be significantly stiffer than a flexible material, but may nevertheless have a modest degree of flexibility (e.g., enough capability of deforming to enable a case 100 or a portion thereof to become fully engaged with the electronic device retained in the case 100).

By one approach, and as illustrated, the flexible layer 106 can include the inside surfaces (and edge surfaces) of the aforementioned corners 103. So configured, this flexible layer 106 can help to both cushion the corners of the electronic device 400 while also serving to help captivate the corners 103 and hence hold the case 100 in an installed state on the electronic device 400 via friction. The flexible material 106 may also offer an additional benefit of making the corners resistive to slipping, which may be helpful when the case 100 is used as a support as discussed below.

If desired, and as shown in FIG. 3, the flexible layer 106 can have a plurality of holes 301 disposed therethrough. Such an approach can help to ensure an appropriate fit of the case 100 on the electronic device 400. The holes 301 may also be an artifact of manufacturing techniques, and in any event are not necessary to the concept described herein.

The first and second portions 101 and 102 of the case 100 pivotally connect to one another via a hinge 107. The hinge 107 is any structure that enables the first and second portions 101 and 102 to move relative to one another while remaining physically connected to one another. By one approach this hinge 107 is formed using the flexible layer 106 only (i.e., without also employing the rigid layer 105). If desired, this hinge 107 can further include a groove 108 formed in the flexible layer 106. By one approach, for example, this groove 108 can have an inverted isosceles trapezoidal shape as a cross section (though other cross-sectional shapes are possible).

By one optional approach, and as illustrated, this hinge 107 can also include one or more elongated openings 109 disposed through the flexible layer 106 within the groove 108. These elongated openings 109, in turn, can further contribute to the ease by which the two case portions 101 and 102 can be pivoted or swung with respect to one another about the hinge 107. These teachings will accommodate a variety of approaches in these regards, such as a greater or lesser number of openings, openings of different sizes and shapes, and even a plurality of openings that are differently sized and/or shaped as compared to one another as desired.

These teachings will readily accommodate other embellishments or variations. For example, one portion or the other can include one or more openings disposed fully therethrough to accommodate, for example, specific features of the electronic device 400. In this illustration, and by way of example, the first portion 101 of the case 100 includes such an opening 110 to accommodate a camera lens and flash as comprises a part of the electronic device 400. The opening 110 is an example of an accommodating feature that enables camera apparatus to be used when the case 100 is fully installed on the electronic device.

Figure 5:
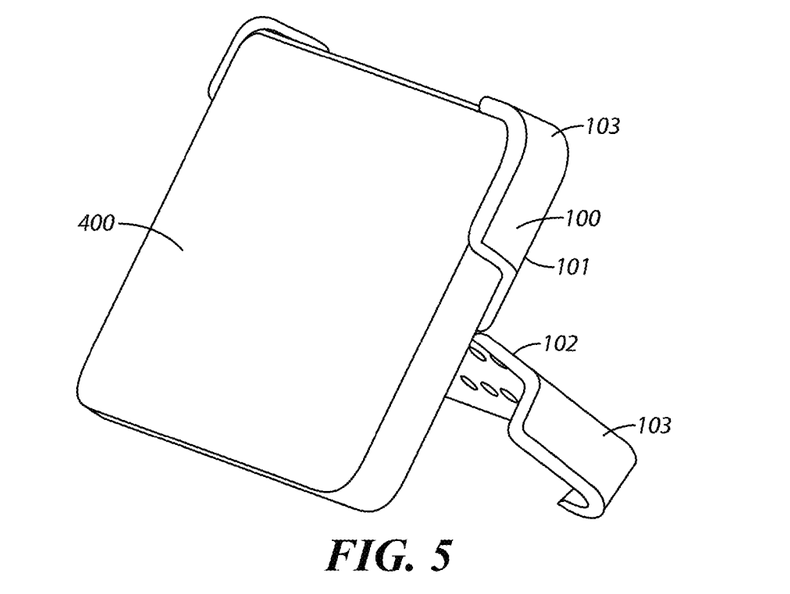
FIG. 5 is a perspective view in accordance with the disclosure.

FIG. 5 depicts the case 100 with the first portion 101 fully installed on the electronic device 400 and the second portion 102 disposed away from and rearwardly of the electronic device 400 (that is, away from the front side of the device 400) about the hinge 107. So configured, the corners 103 of the second portion 102 serve as a stand to hold or support the electronic device 400 in an upright or substantially upright orientation on a surface such as a desk or table to facilitate, for example, viewing the electronic device 400 without a need for the user to hold the electronic device 400. By employing the aforementioned inverted isosceles trapezoidal cross-sectional shape for the hinge groove 108, the second portion 102 will tend to come to a stop when the two sides of the groove 108 meet and hence help to maintain this stand state. In the event the device 400 is fully installed in the cover 100, such as is depicted in FIG. 4, and the user may support the device 400 as shown in FIG. 5 by disengaging the second portion 102 from the device 400 and moving the second portion 102 rearward. In this way, the device 400 and the cover 100 can cooperate to form a stable base that can rest on a surface such as a desk, and the display of the device 400 can be propped up for convenient viewing or other interaction. The user can also return the case 100 and device to the depiction of FIG. 4 by re-engaging the second portion 102 with the device 400 so that the second portion 102 is once again fully installed on the device 400.

Figure 6:
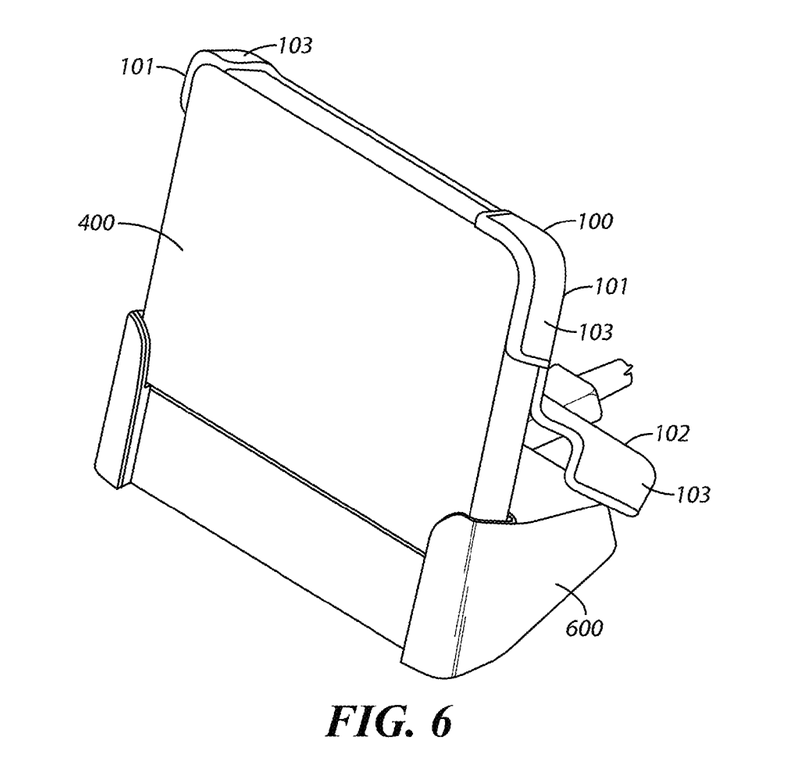
FIG. 6 is a perspective view in accordance with the disclosure.
Figure 7:
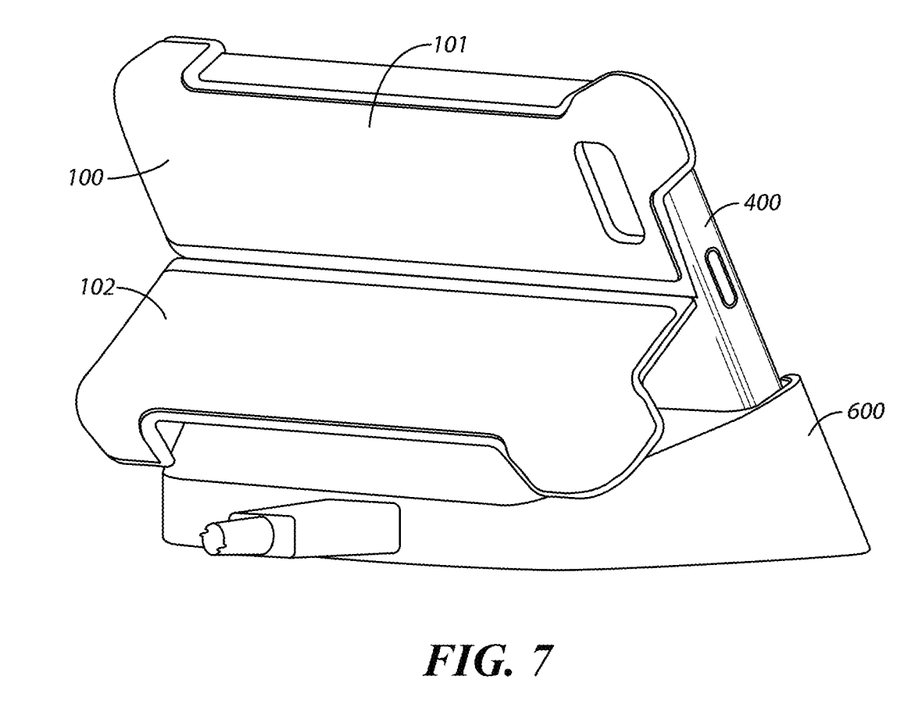
FIG. 7 is a rear perspective view in accordance with the disclosure.

This pivoting capability of the two case portions 101 and 102 can serve in other regards if desired. In the illustrative examples shown at FIGS. 6 and 7 the electronic device 400 is readily placed in a charging dock 600 notwithstanding that the case 100 remains installed on the electronic device 400 via the first portion 101 of the case 100. Such a configuration is possible because the second portion 102 of the case 100 is separated from the electronic device 400 and pivoted away from the electronic device 400 to thereby permit the base of the electronic device 400 to enter the charging dock 600 without obstructing the electronic device's charging interface.

Figure 8:
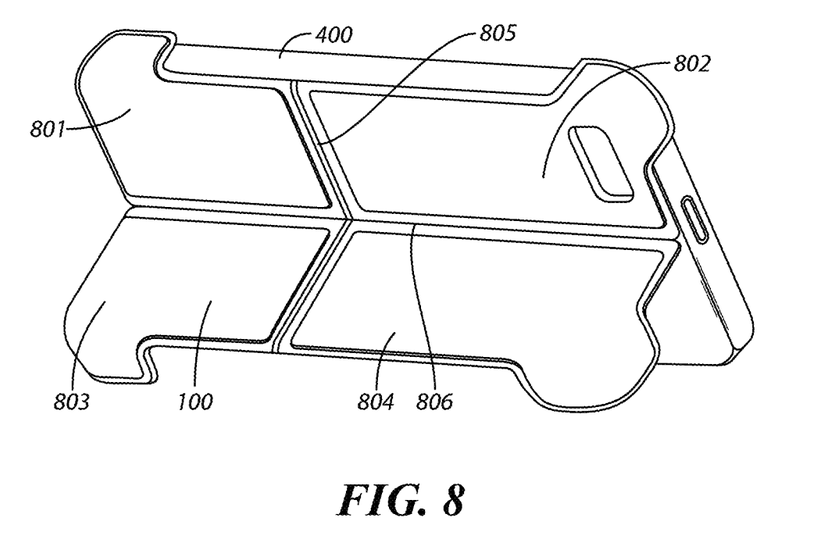
FIG. 8 is a rear perspective view in accordance with the disclosure.

FIG. 8 depicts a further variation in which the case 100 includes a first portion 801, a second portion 802, a third portion 803, and a fourth portion 804. These portions are connected by way of two hinges 805 and 806, which may be substantially perpendicular to one another. The intersection of the hinges 805 and 806 may be, but need not be, proximate to the geometric center of the case 100. As shown in FIG. 8, the intersection of the hinges 805 and 806 is offset from the geometric center, and the hinge 806 is longer than the hinge 805 because the device 400 and the case 100 may have a substantially rectangular or rounded rectangular form factor.

As depicted in FIG. 8, the first portion 801 and second portion 802 are fully installed on the electronic device 400, while the third portion 803 and fourth portion 804 have been moved rearward. The first portion 801 and second portion 802 are substantially co-planar with each other. The third portion 803 and fourth portion 804 are substantially co-planar with each other, and are depicted as pivoted away from the plane of the first portion 801 and second portion 802 by way of the longer hinge 806. The first portion 801 and second portion 802 are fully installed on the electronic device 400, while the third portion 803 and fourth portion 804, in concert with the device 400, form a stable base that can rest on a surface such as a desk.

Figure 9:
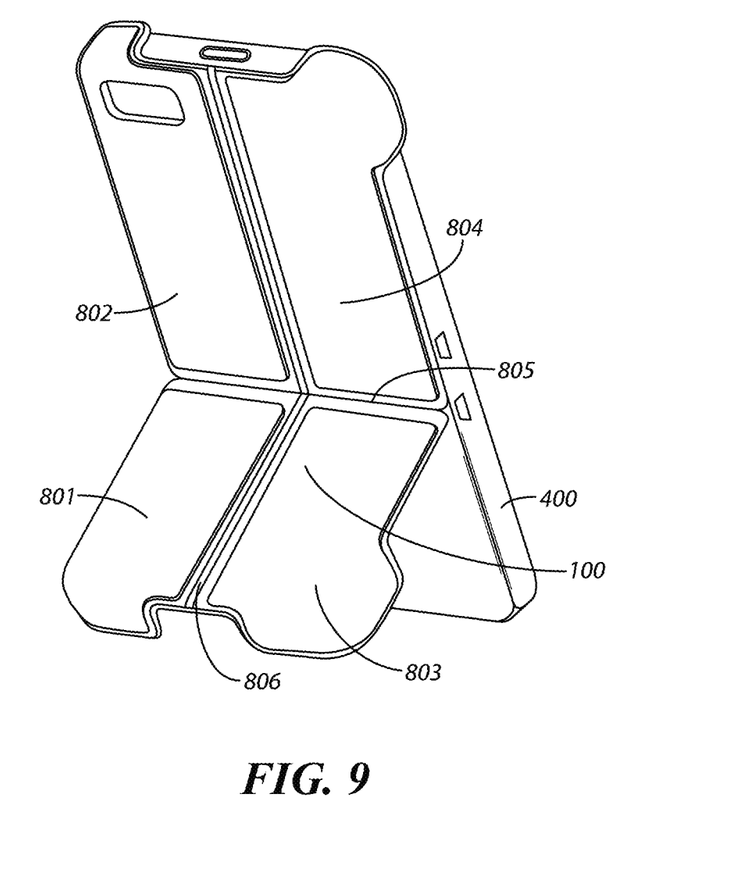
FIG. 9 is a rear perspective view in accordance with the disclosure.

FIG. 9 shows the same embodiment of same case as shown in FIG. 8, but in this depiction, the second portion 802 and fourth portion 804 are fully installed on the electronic device 400, while the first portion 801 and third portion 803 have been moved rearward. In this depiction, the shorter hinge 805 provides the pivoting action. FIGS. 8 and 9 together illustrate how a single case 100, through manipulation of various portions of the case 100, can form at least two supports or stands, one propping the electronic device 400 in a landscape orientation and the other propping the electronic device 400 in a portrait orientation.

Different numbers and positions and shapes of portions and hinges may be deployed in addition to those specifically shown. Implementation of one or more embodiments may realize one or more potential advantages, some of which have been mentioned already. So configured, such a case 100 can provide considerable protection to an electronic device without also presenting any (or hardly any) visual or physical interference between the user and the display side of the electronic device 400. The case 100 need not add much additional bulk to the device 400, either in terms of size or weight, and may have a negligible impact on portability. Further, a single case 100 can perform multiple disparate functions (such as protecting the device 400 from impacts and serving as support). This case 100 is readily manipulated between various configurations and states to accommodate a variety of use paradigms and situations without requiring that the entire case 100 be removed from the electronic device 400 (such as propping up or interacting with another component such as a charging dock 600). In configurations or states in which a portion of the case 100 is or remains fully installed on the electronic device 400, there can be less risk that the case 100 will be inadvertently lost or misplaced. This also helps to ensure that the user will make continued or at least regular use of the case 100 and hence receive the protective benefits of that use.

In the typical configuration discussed herein, such a case 100 will protect principally the back side of the electronic device and the corner areas of the electronic device when fully installed on the electronic device. In some embodiments, the case may protect only the back side and corners; for many electronic devices and many application settings, such an approach provides a good level of protection for the electronic device from impact damage. Notably, although the expected general usage may entail protecting the back side of the electronic device (and the concept has been described in the context of this general usage), a user may choose to install the case backward, so as to protect principally the front side of the device rather than the back side.

Such a case can be economically formed. These teachings are also highly scalable and will accommodate a wide variety of differently-sized and differently-shaped electronic devices. That said, it will be appreciated that in this particular instance the case 100 can be mounted on the opposite side of the electronic device 400 rather than on the back side in precisely the same way. A user may choose such an approach to installation, for example, before placing the electronic device 400 in a suitcase, briefcase, or the like to protect the display screen. In such a case these teachings will further accommodate including, for example, a magnet in the case 100 that, when detected by a corresponding sensor or switch in the electronic device 400 to enter a sleep mode of operation when the case 100 is installed on the front side of the electronic device 400. Further, various electronic devices may have a variety of components and functionality, and one or more accommodating features may accommodate such components and functionality.

Although various words and phrases have been used to describe some of the components or elements of some embodiments of the concept, the components or elements may also be described as means for performing the a function described or shown. For example, a hinge may alternatively be described as a means for hingeably connecting one element to another.

Figure 10:
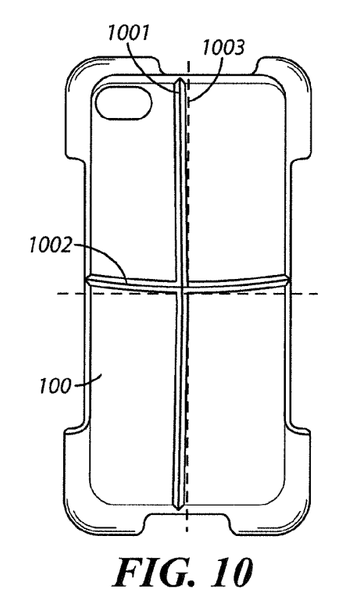
FIG. 10 is a top plan view in accordance with the disclosure.
Figure 11:
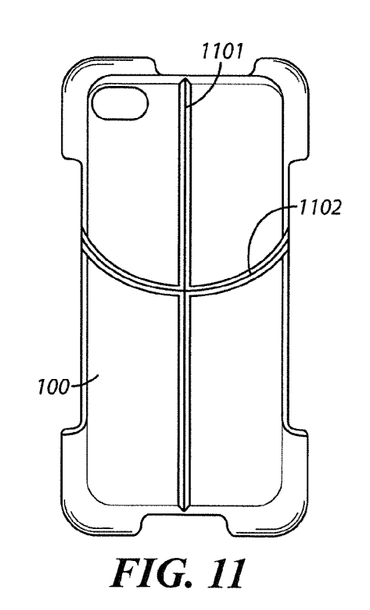
FIG. 11 is a top plan view in accordance with the disclosure.
Figure 12:
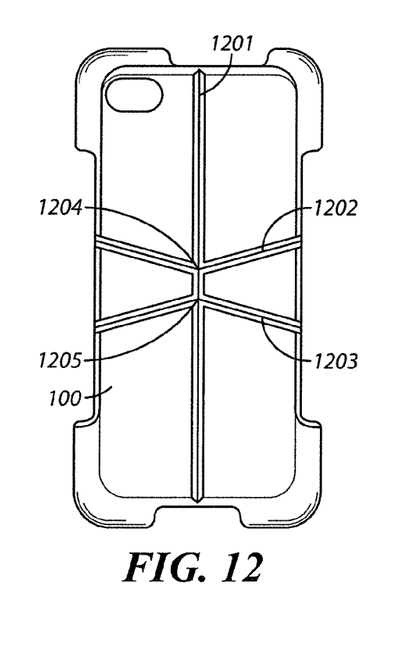
FIG. 12 is a top plan view in accordance with the disclosure.
Figure 13:
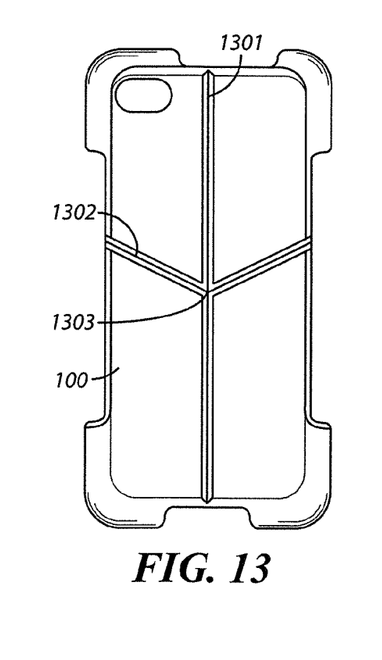
FIG. 13 is a top plan view in accordance with the disclosure.

The present disclosure may be embodied in other specific forms without departing from its essential characteristics. By way of some non-limiting examples in these regards, FIGS. 10 through 13 present cases 100 having a variety of differently configured hinge arrangements. In FIG. 10, for example, the longitudinal and lateral hinges 1001 and 1002 are curved rather than straight (with an X-Y coordinate axis 1003 being provided to help illustrate those curves by way of comparison). In FIG. 11, the longitudinal hinge 1101 is straight whereas the lateral hinge 1102 is curved and assumes, in this particular depiction, a somewhat parabolic shape. FIG. 12 presents a case 100 having a straight longitudinal hinge 1201 while having two (rather than one) lateral hinges 1202 and 1203. These two lateral hinges 1202 and 1203, in turn, are each comprised of two relatively straight segments having their corresponding vertices 1204 and 1205 oriented towards one another. And in FIG. 13 the case 100 has a single longitudinal hinge 1301 that intersects at the vertex 1303 of a pair of hinge lines that together form a lateral hinge 1302 across the case 100. The present teachings will accommodate numerous other variations in these regards as well.

The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

We claim:

1. An apparatus configured for use with an electronic device, the apparatus comprising:
 a case comprising, at least in part, a flexible layer, the case configured to protect at least a portion of said electronic device, the case comprising:
 a first portion configured to only cover a first portion of a back side and two entire corner areas of said electronic device when fully installed on said electronic device, such that there is a gap in the first portion of the case that covers the two entire corner areas of said electronic device, the gap in the first portion of the case being disposed between areas that cover the two entire corner areas of said electronic device, to thereby fully expose a corresponding side edge of said electronic device between the two entire corner areas when the first portion is fully installed on said electronic device;
 a second portion configured to only cover a remaining portion of the back side and two entire corner areas of said electronic device when fully installed on said electronic device, such that there is a gap in the second portion of the case that covers the two entire corner areas of said electronic device, the gap in the second portion of the case being disposed between areas that cover the two entire corner areas of said electronic device, to thereby fully expose a corresponding side edge of said electronic device between the two entire corner areas when the first portion is fully installed on said electronic device; and a hinge that connects the first portion of the case to the second portion of the case, the hinge comprising:
 a groove formed in the flexible layer; and
 at least one elongated opening disposed through the flexible layer within the groove.

2. The apparatus of claim 1 wherein the first portion of the case, the second portion of the case, and the hinge comprise a unitary structure.

3. The apparatus of claim 2 wherein the unitary structure comprises a co-molded structure.

4. The apparatus of claim 1 wherein the case further comprises a rigid layer comprising polycarbonate, and wherein the flexible layer comprises thermoplastic elastomer.

5. The apparatus of claim 1 wherein the groove formed in the flexible layer has an inverted isosceles trapezoidal shape as a cross section.

6. The apparatus of claim 1 wherein the hinge further comprises at least one additional elongated opening disposed through the flexible layer within the groove.

7. The apparatus of claim 1 wherein the case installs on the electronic device via friction fits at corner areas of the electronic device.

8. The apparatus of claim 1 wherein the case is further configured such that the second portion of the case serves as a stand for the electronic device when the first portion of the case is installed on the electronic device and when the second portion of the case is disposed away from and rearwardly of the electronic device about the hinge.

9. The apparatus of claim 1 wherein at least one of the first portion of the case and the second portion of the case has at least one opening disposed therethrough.

10. An apparatus configured for use with an electronic device, the apparatus comprising:

a case comprising, at least in part, a flexible layer, the case configured to protect at least a portion of said electronic device, the case further comprising:

a first portion configured to only cover a first portion of a back side and two entire corner areas of the electronic device when fully installed on the electronic device, such that there is a gap in the first portion of the case that covers the two entire corner areas of the electronic device, the gap in the first portion of the case being disposed between areas that cover the two entire corner areas of said electronic device, to thereby fully expose a corresponding side edge of said electronic device between the two entire corner areas when the first portion is fully installed on said electronic device;

a second portion configured to only cover a remaining portion of the back side and two entire corner areas of the electronic device when fully installed on the electronic device, such that there is a gap in the second portion of the case that covers the two entire corner areas of the electronic device, the gap in the second portion of the case being disposed between areas that cover the two entire corner areas of said electronic device, to thereby fully expose a corresponding side edge of said electronic device between the two entire corner areas when the first portion is fully installed on the electronic device; and a hinge that connects the first portion of the case to the second portion of the case, the hinge comprising:
  a groove formed in the flexible layer; and
  at least two elongated openings disposed through the flexible layer within the groove.

* * * * *